(12) United States Patent
Lee et al.

(10) Patent No.: US 7,802,133 B2
(45) Date of Patent: Sep. 21, 2010

(54) SYSTEM AND METHOD FOR ADDRESSING ERRORS IN A MULTIPLE-CHIP MEMORY DEVICE

(75) Inventors: KoonHee Lee, South Burlington, VT (US); Ryan Patterson, Burlington, VT (US); Hoon Ryu, Cary, NC (US); Klaus Nierle, Essex Junction, VT (US)

(73) Assignee: Qimonda North America Corp., Durham, NC (US)

( * ) Notice: Subject to any disclaimer, the term of this patent is extended or adjusted under 35 U.S.C. 154(b) by 511 days.

(21) Appl. No.: 11/819,759

(22) Filed: Jun. 29, 2007

(65) Prior Publication Data

US 2009/0006887 A1    Jan. 1, 2009

(51) Int. Cl.
*G06F 11/00* (2006.01)
(52) U.S. Cl. .......................................... 714/8; 714/710
(58) Field of Classification Search ........................ None
See application file for complete search history.

(56) References Cited

U.S. PATENT DOCUMENTS

| | | | |
|---|---|---|---|
| 4,939,694 A | 7/1990 | Eaton et al. | |
| 6,052,798 A * | 4/2000 | Jeddeloh | 714/8 |
| 6,181,614 B1 | 1/2001 | Aipperspach et al. | |
| 6,212,648 B1 * | 4/2001 | Abe | 714/8 |
| 7,284,166 B2 * | 10/2007 | Zappa et al. | 714/710 |
| 2006/0031726 A1 * | 2/2006 | Zappa et al. | 714/718 |
| 2007/0168772 A1 * | 7/2007 | Marr | 714/710 |
| 2008/0229161 A1 * | 9/2008 | Lee et al. | 714/710 |
| 2008/0270703 A1 * | 10/2008 | Henrion et al. | 711/128 |

* cited by examiner

*Primary Examiner*—Michael C Maskulinski
(74) *Attorney, Agent, or Firm*—Coats & Bennett, P.L.L.C.

(57) ABSTRACT

A multiple-chip memory device, comprising: a volatile memory element configured to store a plurality of bits of information, and later access the plurality of bits of information; a non-volatile memory element configured to store initial repair information identifying one or more errors in the volatile memory element; and a master memory controller configured to read the initial repair information, and to provide processed repair information and volatile memory control signals to the volatile memory element, wherein the volatile memory element is configured to store and access the plurality of bits of information based on the processed repair information and logical address information.

7 Claims, 4 Drawing Sheets

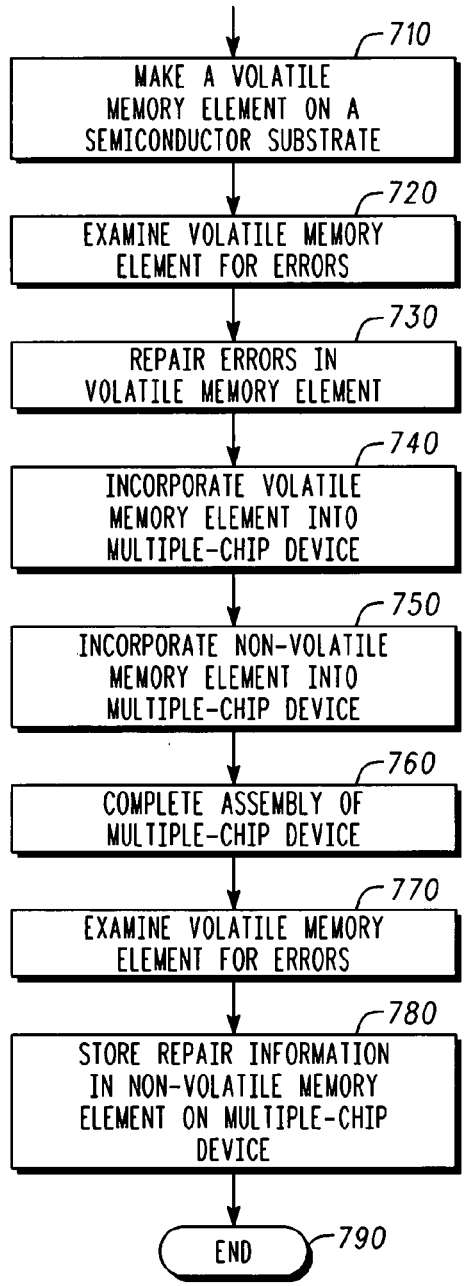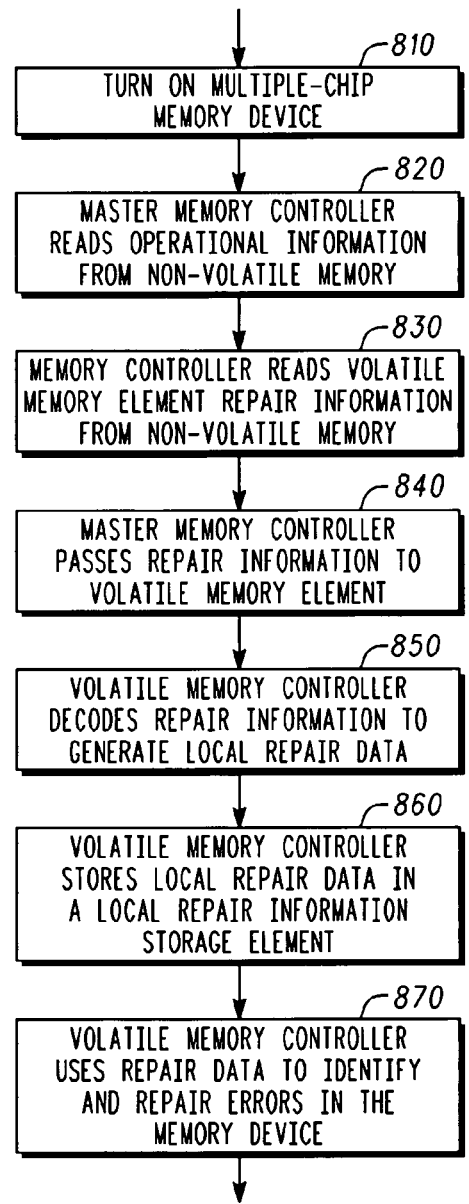

SYSTEM AND METHOD FOR ADDRESSING ERRORS IN A MULTIPLE-CHIP MEMORY DEVICE

FIELD OF THE INVENTION

The present invention relates in general to a multiple chip memory device, and more particularly to a system and method for addressing errors in such a multiple-chip memory device in which one device is a volatile memory, another device is a non-volatile memory, and the errors addressed are in the volatile memory.

BACKGROUND OF THE INVENTION

Various sorts of volatile memories are available in the marketplace for the temporary storage of volatile data. They include dynamic random access memories (DRAMs), static random access memories (SRAMs), and the like. And such large memories are commonly used in a large variety of electronic devices.

Typically a volatile memory will include a large number of individual memory cells that are arranged in an array. Each memory cell in the memory array can then be identified by a unique combination of row address and column address. Some implementations may further split the available memory up into separate memory blocks, with each block containing a separate array. In such an embodiment, each memory cell in the memory array can be identified by a unique combination of bank identifier and row address and column address within the bank.

However, during the manufacturing process of a volatile memory element, errors can arise in individual memory cells within the volatile memory element, rendering them unusable. In order to address this problem, volatile memories will often have a set of redundant memory elements (i.e., memory cells or groups of memory cells), often arranged as redundant rows or redundant columns. These redundant memory elements can then be used in place of the defective memory elements identified during manufacturing.

One common way to account for the defective memory cells is to provide a set of fuses within the volatile memory. During manufacture, each of these fuses can be burned out in a certain pattern so as to identify a defective memory cell or, more commonly, a row or column in the memory array that contains one or more defective memory cells. The information in these fuses can then be used during normal operation of the volatile memory to reroute data requests that are addressed to the defective memory cells to redundant memory cells that are intended to take their place. And since the fuses are permanently burned, the data they contain will remain even when the volatile memory element is shut down for a time.

However, given the manufacturing requirements for burning the fuses properly, the process of identifying the memory errors must take place before the memory device containing the volatile memory is finally assembled. Thus, the volatile memory typically undergoes additional manufacturing processes after fuses are set. And these later processes can result in additional memory cell errors, which will necessarily not be accounted for by the fuses.

It would therefore be desirable to provide a way in which memory cell errors in a volatile memory could be addressed after manufacture and assembly of the memory device was completed.

SUMMARY OF THE INVENTION

A multiple-chip memory device, comprising: a volatile memory element configured to store a plurality of bits of information, and later access the plurality of bits of information; a non-volatile memory element configured to store initial repair information identifying one or more errors in the volatile memory element; and a master memory controller configured to read the initial repair information, and to provide processed repair information and volatile memory control signals to the volatile memory element, wherein the volatile memory element is configured to store and access the plurality of bits of information based on the processed repair information and logical address information.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention.

FIG. 7 is a flow chart of the creating of the multiple-chip memory device of FIG. 1, according to a disclosed embodiment according to a disclosed embodiment; and FIG. 8 is a flow chart of the operating of the multiple-chip memory device of FIG. 1, according to a disclosed embodiment according to a disclosed embodiment.

DETAILED DESCRIPTION

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Much of the inventive functionality and many of the inventive principles when implemented, may be supported with or in integrated circuits (ICs), such as dynamic random access memory (DRAM) devices, static random access memory (SRAM) devices, or the like. In particular, they may be implemented using CMOS transistors. It is expected that one of ordinary skill, notwithstanding possibly significant effort and many design choices motivated by, for example, available time, current technology, and economic considerations, when guided by the concepts and principles disclosed herein will be readily capable of generating such ICs with minimal experimentation. Therefore, in the interest of brevity and minimization of any risk of obscuring the principles and concepts according to the present invention, further discussion of such ICs will be limited to the essentials with respect to the principles and concepts used by the exemplary embodiments.

One way to account for errors that occur after fuse-based error correction is performed on a volatile memory element is to test for those errors after final production of the device containing the volatile memory element, and save that memory in a non-volatile memory. The volatile memory can then access this non-volatile memory each time it powers up, and use the stored error information, just as it would the fused information, to perform error correction. This solution is particularly useful when applied to multiple-chip memory devices that include both a non-volatile memory element and a volatile memory element.

Figure 1:
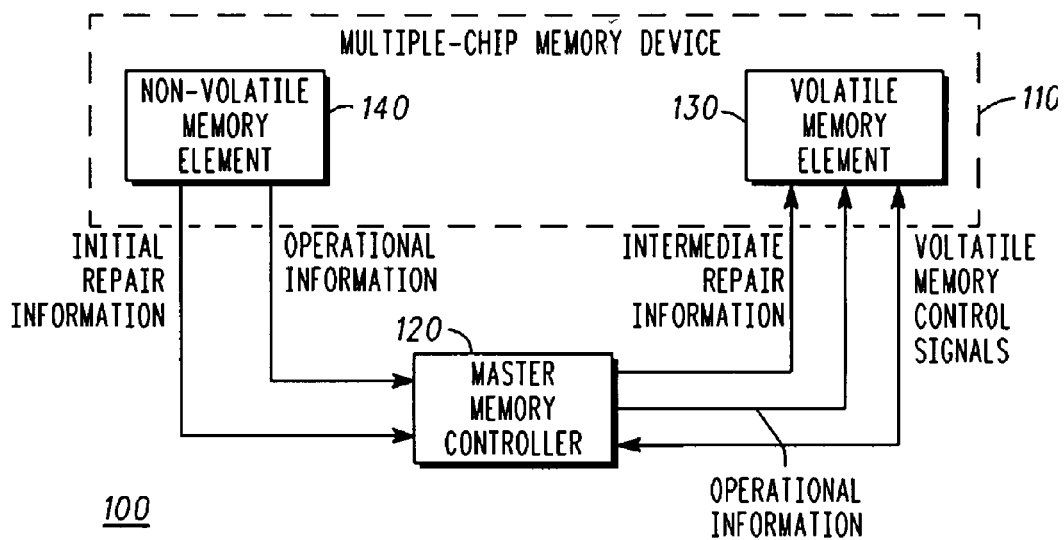
FIG. 1 is a block diagram of a multiple-chip memory combination according to a disclosed embodiment.

FIG. 1 is a block diagram of a multiple-chip (or multiple-element) memory combination according to a disclosed embodiment. As shown in FIG. 1, the multiple-chip memory combination 100 includes a multiple-chip memory device 110 and a master memory controller 120.

The multiple-chip memory device 110 is a memory device that includes at least two separate memory elements: a volatile memory element 130 and a non-volatile memory element 140. These memory elements 130 and 140 are manufactured on separate chips using separate manufacturing processes, but are then both placed in the same multiple-chip package (MCP). The multiple-chip memory device 110 includes input/output lines necessary to separately access both the volatile memory element 130 and the non-volatile memory element 140.

The master memory controller 120 coordinates the operation of both the volatile and non-volatile memory elements 130 and 140, and facilitates communication between the two. Among other functions, the master memory controller 120 coordinates the transfer of data from the non-volatile memory element 140 to the volatile memory element 130 that is required for initializing the volatile memory upon it being turned on. This information can include both operational data and repair data. In particular, the master memory controller 120 reads operational information and initial repair information from the non-volatile memory 140 and provides intermediate repair information, operational information, and volatile memory control signals to the volatile memory element 130.

The volatile memory element 130 stores volatile data, and is generally used by an external device as a volatile data storage element. Its memory elements retain no information when it is powered down, and so it must be reinitialized every time it's turned on, typically using initialization data received from the non-volatile memory element 140. The volatile memory element 130 could be a dynamic random access memory (DRAM) element, a static random access memory (SRAM) element, or any memory device that stores its data in a volatile manner.

The non-volatile memory element 140 stores permanent memory information that will be needed by the multiple-chip memory device 110, or by an external device connected to the multiple-chip memory device 110. This non-volatile information can include initialization data or repair data for the volatile memory 130. The non-volatile memory element 140 could include a flash memory element, a phase change random access memory (PCRAM) element, an electrically erasable programmable read only memory (EEPROM) element, a ferroelectric random access memory (FRAM) element, a magnetoresistive random access memory (MRAM) element, or any memory element that stores its data in a non-volatile manner.

Figure 2:
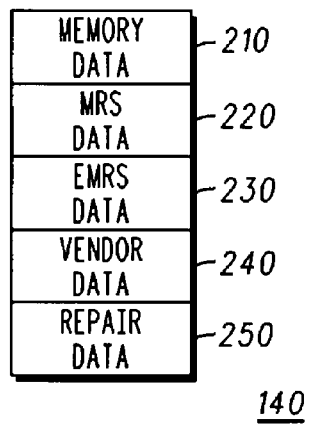
FIG. 2 is a block diagram of the non-volatile memory element of FIG. 1, according to a disclosed embodiment.

FIG. 2 is a block diagram of the non-volatile memory element of FIG. 1, according to a disclosed embodiment. In particular, FIG. 2 shows memory blocks contained within the non-volatile memory element 140 that contain initialization data needed by the volatile memory element 130 during an initialization process. As shown in FIG. 2, the non-volatile memory element 140 includes a DRAM data block 210, a mode register setup (MRS) data block 220, an extended MRS (EMRS) data block 230, a vendor data block 240, and a repair data block 250. Collectively the DRAM data block 210, the MRS data block 220, the EMRS data block 230, and the vendor data block 240 could be considered the operational data needed by the volatile memory.

The memory data block 210 includes address bits and data bits required by the volatile memory to inform memory controller. In embodiments in which the volatile memory is a DRAM device, the memory data block is a DRAM data block. The details of the memory data would be understood by one skilled on the art. DRAM data can provide such information as the memory size in the MCP.

The MRS data block 220 contains MRS data that is used by the volatile memory element 130 to set operational modes. The details of the MRS data would be understood by one skilled on the art. Likewise, the EMRS data block 230 contains EMRS data that is used by the volatile memory element 130 to set extended operational modes. The details of the EMRS data would be understood by one skilled on the art. The MRS data and EMRS data can include data bits that identify an operating mode that the volatile memory should enter.

The vendor data block 240 includes data specific to the operation of the volatile memory element 130 that is provided by the vendor. The vendor data can include any data that the vendor considers important for the volatile memory to have.

The repair data block 250 includes initial repair information that identifies errors in the volatile memory by their location (i.e., their unique address in the volatile memory). For each piece of repair data this can include information about the type of error (e.g., a broken memory cell), non-address location information (e.g., the memory bank in the volatile memory in which the error is located), and the unique address that identifies the location of the error (e.g., a logical address in the volatile memory element's array of memory cells).

Figure 3:
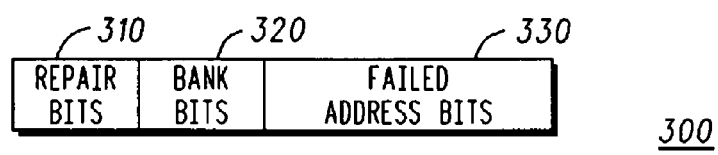
FIG. 3 is a block diagram of the format of data stored in the repair data block of FIG. 2, according to a disclosed embodiment.

FIG. 3 is a block diagram of the format of data stored in the repair data block of FIG. 2, according to a disclosed embodiment. As shown in FIG. 3, each element 300 of the repair data block 250 includes a set of repair bits 310, a set of bank bits 320, and a set of failed address bits 330. A repair data block 250 will typically contain many elements 300, each identifying a different necessary repair in the volatile memory element 130.

The repair bits 310 provide an indication as to what kind of error, if any, is being described. In some embodiments, one repair bit indicates whether or not the element 300 in the repair data block 250 represents an error at all. In such embodiments the repair bits can be used by the volatile memory element 130 to determine whether to process the repair data element 300 or ignore it. This can be useful in embodiments in which the entire repair data block will be passed to the volatile memory element 130, regardless of whether it is full or not.

Furthermore, although the repair bits 310 are described in plural, they can be a single bit or multiple bits. If multiple repair bits are used, the additional bits can provide more information regarding the type of error identified (e.g., column error, row error, block error, or the like).

The bank bits 320 indicate in which bank in the volatile memory element 130 the identified error is contained. In some embodiments this could be a set of bits that can uniquely identify each bank. For example, if there are four memory banks in the volatile memory, the bank bits could be two bits in which 00 represents the first bank, 01 represents the second bank, 10 represents the third bank, and 11 represents the fourth bank.

In other embodiments in which the volatile memory element 130 has only a single memory bank, this block can be omitted. Furthermore, alternate embodiments could have other mechanisms for locating data. In such an embodiment the bank bits could be replaced or augmented with additional non-address location information.

The failed address bits 330 identify the location of the identified error in the specified bank in the volatile memory element 130. In some embodiments this can be a logical address in the volatile memory 130 (i.e., an address identifying the logical position of the error within the array of memory elements in the bank); in other embodiments this can be a physical address in the volatile memory 130 (i.e., an address identifying the actual physical position of the error within the array of memory elements in the bank).

In addition, although FIG. 3 shows a specific format of the repair data elements 300, this format is simply by way of example and should not be considered limiting. The repair data elements 300 can have any desired format that passes on the information required for the volatile memory element 130 to properly identify the existence, type, and location of an error in the volatile memory element 130. If more or fewer groupings of memory elements are used, they should be properly identified in the repair data elements 300.

Figure 4:
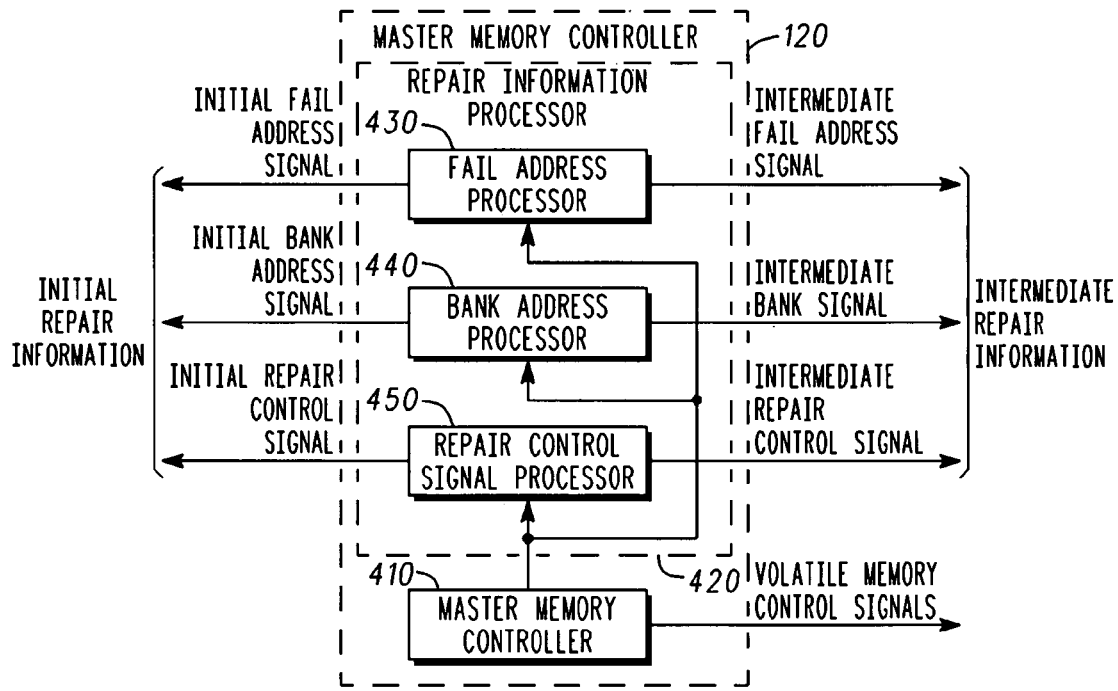
FIG. 4 is a block diagram of the master memory controller of FIG. 1, according to a disclosed embodiment.

FIG. 4 is a block diagram of the master memory controller of FIG. 1, according to a disclosed embodiment. As shown in FIG. 4, the master memory controller 120 includes a master memory controller 410 and a repair information processor 420.

The master memory controller 410 controls the operation of the repair information processor 420, and provides volatile memory control signals to the volatile memory 130 to control aspects of its operation, particularly during power up and initialization.

The repair information processor 420 receives the initial repair information from the non-volatile memory 140 and performs any required processing to convert it into intermediate repair information, which is then sent to the volatile memory element 130. In the disclosed embodiment, the initial repair information includes an initial repair control signal, an initial bank address, and an initial fail address (which correspond to the set of repair bits 310, the set of bank bits 320, and the set of failed address bits 330 in each repair data element 300). The repair information processor 420 further includes a fail address processor 430, a bank address processor 440, and a repair control signal processor 450.

The fail address processor 430 receives the initial fail address signal and converts it to an intermediate fail address signal. In some embodiments this may involve simply passing an initial fail address signal unchanged as the intermediate fail address signal. In other embodiments, some additional processing may be required to properly format the intermediate fail address signal. For example, a logical memory address could be converted to a physical memory address.

The bank address processor 440 receives the initial bank address signal and converts it to an intermediate bank address signal. In some embodiments this may involve simply passing the initial bank address signal unchanged as the intermediate bank address signal. In other embodiments, some additional processing may be required to properly format the intermediate bank address signal. For example, a two bit initial bank address may be converted to four individual bank enable lines.

The repair control signal processor 450 receives the initial repair control signal and converts it to an intermediate repair control signal. In some embodiments this may involve simply passing the initial repair control signal unchanged as the intermediate repair control signal. In other embodiments, some additional processing may be required to properly format the intermediate repair control signal. The initial repair control signal indicates whether or not post repair is necessary, and if it is, which repair method should be used (e.g., row repair, column repair, block repair, cell repair, etc.).

In alternate embodiments in which different initial repair information is disclosed in the repair data block 250 of the non-volatile memory 140, the master memory controller 120 can be adjusted accordingly to receive and process the appropriate initial repair information to generate the corresponding intermediate repair information.

Although not shown in FIG. 4, the master memory controller 120 also passes the operational information from the non-volatile memory 140 to the volatile memory 130.

Figure 5:
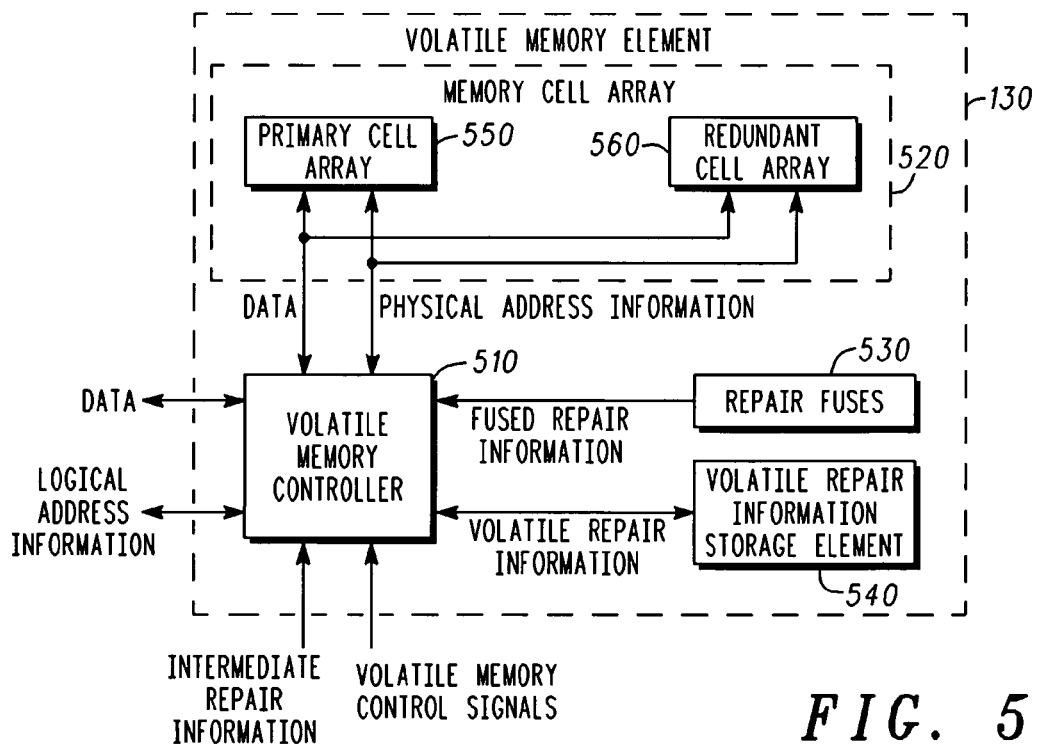
FIG. 5 is a block diagram of the volatile memory element of FIG. 1, according to a disclosed embodiment.

FIG. 5 is a block diagram of the volatile memory element of FIG. 1, according to a disclosed embodiment. As shown in FIG. 5, the volatile memory element 130 includes a volatile memory controller 510, a memory cell array 520, a set of repair fuses 530, and a volatile repair information storage element 540.

The volatile memory controller 510 coordinates the operation of the volatile memory element 130. It receives the intermediate repair information and volatile memory control signals from the master memory controller 120 as well as data and logical address information from an external device. In addition, while not shown in FIG. 5, the volatile memory controller also receives operational information from the master memory controller 120.

During an initialization process of the non-volatile memory element 130, the volatile memory controller 510 uses the intermediate repair information and volatile memory control signals to populate the volatile repair information storage element 540 with volatile repair information that identifies errors in the memory cell array that were described in the repair data block 250 in the non-volatile memory 140

During normal operation of the non-volatile memory element 130, the volatile memory controller 510 uses the volatile repair information from the volatile repair information storage element 540 and the logical address information from an external device to store data to and retrieve data from a given memory cell array.

If it had no errors, the volatile memory controller 510 would only have to convert the logical address information to physical address information and access individual memory cells the memory cell array based on their physical addresses. However, since errors may be present, the volatile memory controller 510 must account for the presence of broken memory cells by rerouting logical addresses that identify broken cells from their original corresponding physical addresses to the physical addressees of functioning redundant cells that take the place of the broken memory cells.

One way the volatile memory controller 510 can do this is to check each incoming logical address to see if it is identified in either the repair fuses 530 or the volatile repair information storage element 540 as being addressed to a broken cell. If no error is associated with that incoming logical address, then the address conversion proceeds accordingly. If, however, an error is identified, the volatile memory controller 510 performs a different address conversion process to access a redundant memory cell that takes the place of the broken memory cell.

The memory cell array 520 is where the data is actually stored in the volatile memory 130. It further includes a primary cell array area 550 and a redundant cell array area 560. The memory cell array may be broken up into additional subdivided memory arrays (e.g., banks or the like) or may be one large memory array. The data cells in the memory cell array 520 are accessed by a data bus and are addressed using the physical address information, where each physical address uniquely identifies one memory cell in either the primary cell array area 550 or the redundant cell array area 560.

The primary cell array area 550 is an array of memory cells that represent the number of bits the volatile memory element is intended to hold. For example, if the volatile memory element is a 10 Mbit memory, the primary cell array area 550 will include 10,000,000 memory cells.

The redundant cell array area 560 is a set of memory cells available to be used in place of broken cells in the primary cell array 550. In some embodiments elements in the redundant cell array 560 replace individual memory cells in the primary cell array 550; in other embodiments it replaces entire blocks in the primary cell array 550 if even one error appears in a corresponding block. For example, the redundant cell array 560 could replace entire rows or columns of memory cells in the primary cell array area 550. Alternatively, the redundant cell array 560 could replace blocks of memory cells of other shapes in the primary cell array area 550.

The set of repair fuses 530 contains fused repair information that identifies the addresses of broken memory cells, memory rows, memory columns, or memory blocks that were identified during a manufacturing process of the volatile memory element 130. The data in the set of repair fuses 530 is non-volatile by nature, and so can be read directly by the volatile memory controller 510, regardless of whether the volatile memory element 130 has been turned off or not.

The volatile repair information storage element 540 stores volatile repair information that indicates some or all of the addresses of broken memory cells, rows, columns, or blocks. It could be a set of registers or any memory element. In some embodiments the local repair data includes only the memory addresses identified by the intermediate repair information. In this case, the volatile memory controller 510 must check both the volatile repair information and the fused repair information when converting incoming logical address information to physical address information. In other embodiments, the local repair data includes both the intermediate repair information and the fused repair information. In this case, the volatile memory controller 510 need check only the local repair data when converting incoming logical address information to physical address information.

Although FIG. 5 discloses an embodiment in which the volatile memory element 130 receives logical address information, in alternate embodiments it could receive physical address information. In this case the volatile memory controller 510 would only have to modify the received address information based on identified errors in the memory cell array 520, and would not have to translate from logical addresses to physical addresses or vice versa.

Figure 6:
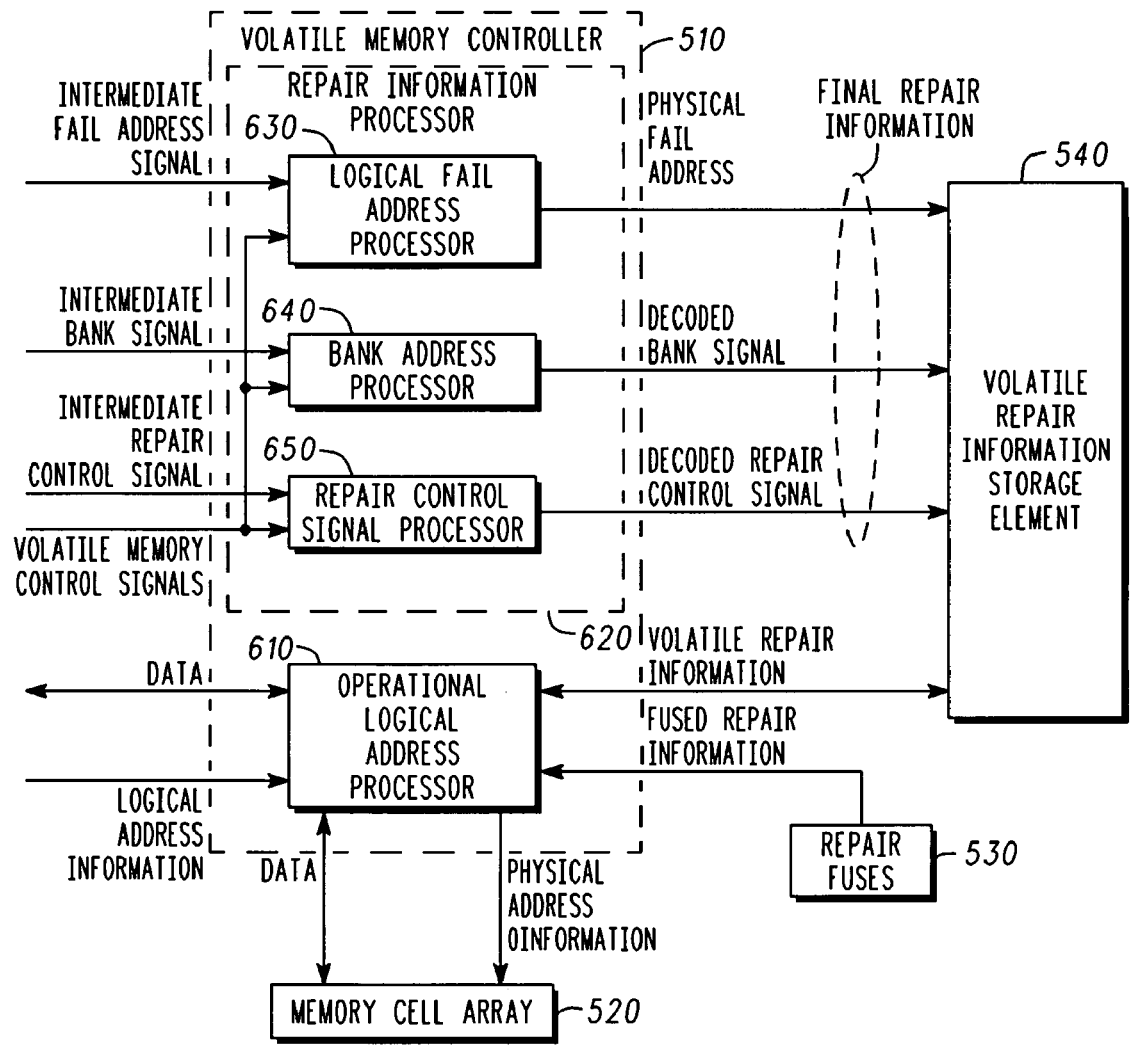
FIG. 6 is a block diagram of a portion of the volatile memory element of FIGS. 1 and 5, according to a disclosed embodiment.

FIG. 6 is a block diagram of a portion of the volatile memory element of FIGS. 1 and 5, according to a disclosed embodiment. As shown in FIG. 6, the volatile memory element 500 includes a volatile memory controller 510, a memory cell array 520, a set of repair fuses 530, and a volatile repair information storage element 540, as described above with respect to FIG. 5. In this embodiment, the volatile memory controller 510 further includes an operational logical address processor 610 and a repair information processor 620.

The operational logical address processor 610 receives logical address information from an external device, fused repair information from the repair fuses 530, and volatile repair information from the volatile repair storage element 540, and from this information converts the logical address information into physical address information.

Absent an error, the operational logical address processor 610 converts the logical address information to the physical address information based on a known mapping function in which each logical address in the logical address information corresponds to a single physical address in the physical address information. But if an error is present, the operational logical address processor 610 will have to substitute an alternate physical address (i.e., that of a redundant memory cell) when the actual physical address that corresponds to a given logical address is known to identify a faulty primary memory cell. This substitution can be done according to a known substitution scheme so that the same logical address will always result in the same substituted physical address.

Once the logical address information is properly converted to physical address information, the operational logical address processor 610 either stores data received from the external device into the memory cell array in a memory cell identified by the physical address, or retrieves data stored in the memory cell array from a memory cell identified by the physical address and sends that data to the external device.

In some embodiments the operational logical address processor 610 can write the fused repair information into the volatile repair storage element 540 during an initialization procedure. In such an embodiment the volatile repair storage element 540 will then contain a listing of all of the error data. In this case, the volatile repair information will include both the final repair information and the fused repair information. As a result of this, the logical address processor 610 need only access the volatile repair storage element 540 to perform an error checking and correction process for the logical address information.

Also, as noted above, in some embodiments the volatile memory element 130 may receive physical address information from the external device. In this case, the operational logical address processor 610 functions to correct the physical address information based on the fused repair information and the volatile repair information.

The repair information processor 620 receives the intermediate repair information from the master memory controller 120, and performs any necessary processing on it before it is stored in the volatile repair information storage element 540 as final repair information. It further includes a logical fail address processor 630, a bank address processor 640, and a repair control signal processor 650.

The logical fail address processor 630 receives the intermediate fail address signal and volatile memory control signals from the master memory controller 120, and processes the intermediate fail address signal to produce a physical fail address. This processing could include converting an intermediate fail address from a logical address to a physical address, or it could simply involve passing an intermediate fail address as the physical fail address.

The bank address processor 640 receives the intermediate bank signal and volatile memory control signals from the master memory controller 120, and processes the intermediate bank signal to produce a decoded bank signal. This could involve converting bank identifying data into a plurality of bank enable signals (with the relevant bank enabled), or it could involve passing the intermediate bank signal as the decoded bank signal.

The repair control signal processor 650 receives the intermediate repair control signal and volatile memory control signals from the master memory controller 120, and processes the intermediate repair control signal to produce a decoded repair control signal. This could involve converting intermediate repair and control data into column, row, or block enable signals (identifying a whether it is a column, row, or block to be corrected), or it could involve passing the intermediate repair control signal as the decoded repair control signal.

Collectively the physical fail address, the decoded bank signal, and the decoded repair signal form final repair information. In embodiments in which no additional data is stored in the volatile repair information storage element 540, the final repair information forms the volatile repair information. However, in embodiments in which the fused repair information is also stored in the volatile repair information storage element 540, the volatile repair information is formed by both the final repair information and the fused repair information.

Furthermore, although the repair information processor 620 is shown as having processors to handle the intermediate fail address signal, the intermediate bank signal, and the intermediate repair control signal, in alternate embodiments it could include more or fewer processors as needed by whatever set of intermediate repair information is provided.

FIG. 7 is a flow chart of the creating of the multiple-chip (or multiple element) memory device of FIG. 1, according to a disclosed embodiment according to a disclosed embodiment.

As shown in FIG. 7, the creation process 700 starts by making a volatile memory element on a semiconductor substrate (710). This volatile memory element could be a dynamic random access memory (DRAM) element, a static random access memory (SRAM) element, or any memory device that stores its data in a volatile manner. During this creation process, certain errors are likely to occur in the individual memory cells in the volatile memory element.

Therefore, after fabrication, but before final assembly, the volatile memory element is examined for errors (720), and the errors are repaired (730). The repair of these errors is often performed by rerouting the address lines from a defective primary memory cell to a working redundant memory cell. One possible way to accomplish this repair operation is through the use of a repair fuse, which is permanently burned in a pattern that indicates how the address rerouting should be accomplished.

In disclosed embodiments, after the errors are repaired (730), the volatile memory element still retains some unused redundancies (e.g., redundant memory cells that newly-identified broken memory cells can be rerouted to). These unused redundancies allow for a second round of error identification and correction.

After the errors are repaired in the volatile memory element, the volatile memory element is incorporated into a multiple-chip device (740), a non-volatile memory device is incorporated into the multiple-chip device (750), and the assembly of the multiple-chip device is completed (760). The non-volatile memory device could include a flash memory element, a phase change random access memory (PCRAM) element, an electrically erasable programmable read only memory (EEPROM) element, a ferroelectric random access memory (FRAM) element, a magnetoresistive random access memory (MRAM) element, or any memory device that stores its data in a non-volatile manner. The final assembly of the multiple-chip device can include attaching required input/output lines, encasing the volatile memory device and the non-volatile memory device in a protective casing, etc.

However, the process of incorporating the volatile memory element into the multiple-chip device (740) and the process of final assembly of the multiple-chip device (750) can cause additional errors to occur on the volatile memory element. As a result, after the final assembly of the multiple-chip memory device, the volatile memory is again examined for errors (770). However, unlike when the previous examination operation occurred (720), at this point it is either impossible or extremely difficult to physically correct errors in the volatile memory. Therefore, during the examination process (770), the errors are simply identified, and repair information is generated indicating how the addresses of damaged cells can be rerouted to functioning redundant cells.

Once the examination of errors in the volatile memory element is completed, and all necessary repair information is generated, the repair information, along with certain operational information about the volatile memory, will be stored in the non-volatile memory (780).

Then, once the repair information and operational information are stored in the non-volatile memory, the manufacturing process is completed (790)

The volatile memory can then access the repair information from the non-volatile memory each time it is turned on, and make dynamic repairs before it begins normal operation. This can be done with little additional overhead, since in many multiple-chip memory devices, the volatile memory element will already have to access operational information stored in the non-volatile memory element.

Although the method of FIG. 1 involves two examinations and corrections (one prior to final assembly and one after), in some embodiments the initial set of error examination and correction operations can be eliminated, and all of the errors in the volatile memory can be identified through the later error examination and correction operations.

FIG. 8 is a flow chart of the operating of the multiple-chip memory device of FIG. 1, according to a disclosed embodiment according to a disclosed embodiment.

As shown in FIG. 8, the operation process 800 starts when a multiple-chip (or multiple-element) memory device turns on (810). This multiple-chip memory device includes a volatile memory element and a non-volatile memory element. In addition, a master memory controller is provided to control operation of the multiple elements on the multiple-chip memory device. This master memory controller could be a part of the multiple-chip memory device or separate from the multiple-chip memory device.

Once the multiple-chip memory device is turned on, the master memory controller reads volatile memory element operational information from the non-volatile memory (820). This operational information includes a variety of information such as DRAM data, MRS data, EMRS data, and vendor data. The operational information is used by the master memory controller of the volatile memory element for proper initialization and operation of the volatile memory element.

The master memory controller also reads volatile memory element repair information from the non-volatile memory (830). This repair information indicates the type and location of previously-identified damaged cells, or previously-determined corrections required in the volatile memory element can be rerouted to functioning redundant cells.

The master memory controller then passes the volatile memory element repair information to the volatile memory (840), where a volatile memory controller decodes the repair information to generate local repair data (850). This decoding may correspond to converting logical address information (used externally to address locations in the volatile memory) to physical address information (used internally to address locations in the volatile memory), changing the format of certain repair data, etc.

In addition, although not indicated in FIG. 7, the master memory controller also passes the operational data to the volatile memory element.

Once the volatile memory element repair information is decoded into local repair data, the volatile memory controller then stores the local repair data in a volatile repair information storage element (860). This allows the local repair data to be easily accessible to the volatile memory controller.

The volatile memory controller can then use the local repair data to identify and repair errors in the memory device during memory operations (870). In some embodiments this can be done either along with or in place of the same sort of error correction performed by the volatile memory controller using repair fuses configured during device fabrication.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled. The various circuits described above can be implemented in discrete circuits or integrated circuits, as desired by implementation.

What is claimed is:

1. A method of operating a multiple-chip memory device having a volatile memory element, comprising:
    powering up the multiple-chip memory device;
    reading initial repair information from a non-volatile memory in the multiple-chip memory device, the initial repair information, identifying one or more errors in a volatile memory element in the multiple-chip memory device;
    decoding the initial repair information to generate volatile repair information;
    storing the volatile repair information in a volatile repair information storage element;
    receiving logical address information identifying a logical memory location in a volatile memory element after storing the volatile repair information;
    reading the volatile repair information from the volatile repair information storage element;
    generating physical address information identifying a physical memory location in the volatile memory element based on the logical address information and the volatile repair information;
    wherein the volatile memory element repair information includes a plurality of repair items, each repair item including: one or more control bits indicating operations parameters of an identified error, and a plurality of address bits identifying one a row in the volatile memory element and a column in the volatile memory element.

2. The method of claim 1, wherein the reading of the volatile memory element repair information is performed by reading saved volatile memory data including repair information from the non-volatile memory element.

3. The method of claim 1, wherein each repair item further includes one or more bank bits identifying a memory bank in the volatile memory element.

4. A method of operating a multiple-chip memory device having a volatile memory element, comprising:
    powering up the multiple-chip memory device;
    reading initial repair information from a non-volatile memory in the multiple-chip memory device, the initial repair information identifying one or more errors in a volatile memory element in the multiple-chip memory device;
    decoding the initial repair information to generate volatile repair information;
    storing the volatile repair information in a volatile repair information storage element;
    receiving logical address information identifying a logical memory location in a volatile memory element after storing the volatile repair information;
    reading the volatile repair information from the volatile repair information storage element;
    generating physical address information identifying a physical memory location in the volatile memory element based on the logical address information and the volatile repair information; and
    further comprising reading volatile memory element operational information from a non-volatile memory in the multiple-chip memory device, the volatile memory element operational information identifying at least one operational parameter in the volatile memory element.

5. An apparatus for operating a multiple-chip memory device having a volatile memory element, comprising:
    means for powering up the multiple-chip memory device;
    means for reading initial repair information from a non-volatile memory in the multiple-chip memory device, the initial repair information identifying one or more errors in a volatile memory element in the multiple-chip memory device;
    means for decoding the initial repair information to generate volatile repair information;
    means for storing the volatile repair information in a volatile repair information storage element;

means for receiving logical address information identifying a logical memory location in a volatile memory element after the means for storing stores the volatile repair information;

means for reading the volatile repair information from the volatile repair information storage element;

means for generating physical address information identifying a physical memory location in the volatile memory element based on the logical address information and the volatile repair information; and wherein the volatile memory element repair information includes a plurality of repair items, each repair item including: one or more control bits indicating operations parameters of an identified error, and a plurality of address bits identifying one a row in the volatile memory element and a column in the volatile memory element.

6. The apparatus of claim 5, wherein the means for storing the volatile repair information performs the reading of the volatile memory element repair information by reading saved volatile memory data including repair information from the non-volatile memory element.

7. An apparatus for operating a multiple-chip memory device having a volatile memory element, comprising:

means for powering up the multiple-chip memory device;

means for reading initial repair information from a non-volatile memory in the multiple-chip memory device, the initial repair information identifying one or more errors in a volatile memory element in the multiple-chip memory device;

means for decoding the initial repair information to generate volatile repair information;

means for storing the volatile repair information in a volatile repair information storage element;

means for receiving logical address information identifying a logical memory location in a volatile memory element after the means for storing stores the volatile repair information;

means for reading the volatile repair information from the volatile repair information storage element;

means for generating physical address information identifying a physical memory location in the volatile memory element based on the logical address information and the volatile repair information; and further comprising a means for reading volatile memory element operational information from a non-volatile memory in the multiple-chip memory device, the volatile memory element operational information identifying at least one operational parameter in the volatile memory element.

* * * * *